United States Patent
Besser et al.

(10) Patent No.: US 6,633,085 B1
(45) Date of Patent: Oct. 14, 2003

(54) METHOD OF SELECTIVELY ALLOYING INTERCONNECT REGIONS BY ION IMPLANTATION

(75) Inventors: Paul R. Besser, Sunnyvale, CA (US); Larry Zhao, Austin, TX (US); Donggang David Wu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/884,100

(22) Filed: Jun. 20, 2001

(51) Int. Cl.[7] .............................................. H01L 23/48
(52) U.S. Cl. .................. 257/774; 257/776; 257/763; 257/765; 257/767; 257/643; 438/694; 438/687; 438/688; 438/689
(58) Field of Search ................. 257/750, 758, 257/763, 764, 765, 767, 774, 776, 920; 438/687, 660, 688, 837, 627, 648, 633, 641, 661, 643, 689–694

(56) References Cited

U.S. PATENT DOCUMENTS

| | | | | |
|---|---|---|---|---|
| 5,712,510 A | * | 1/1998 | Bui et al. | 257/758 |
| 5,891,513 A | * | 4/1999 | Dubin et al. | 427/98 |
| 6,057,232 A | * | 5/2000 | Lee | 438/658 |
| 6,121,149 A | * | 9/2000 | Lukanc et al. | 438/692 |
| 6,211,071 B1 | * | 4/2001 | Lukanc et al. | 438/640 |
| 6,242,349 B1 | * | 6/2001 | Nogami et al. | 438/687 |
| 6,261,963 B1 | * | 7/2001 | Zhao et al. | 438/704 |
| 6,268,291 B1 | * | 7/2001 | Andricacos et al. | 438/694 |
| 6,326,287 B1 | * | 12/2001 | Asahina et al. | 438/584 |
| 6,399,478 B2 | * | 6/2002 | Matsubara et al. | 438/623 |

* cited by examiner

Primary Examiner—Nathan J. Flynn
Assistant Examiner—Fazli Erdem

(57) ABSTRACT

A metal interconnect structure and method of making the same implants ions of an alloy elements into a copper line through a via. Then ion implantation of the alloy elements in the copper line through the via provides improved electromigration properties at the copper line at a critical electromigration failure site, without attempting to provide alloy elements throughout the entire copper line.

20 Claims, 4 Drawing Sheets

METHOD OF SELECTIVELY ALLOYING INTERCONNECT REGIONS BY ION IMPLANTATION

FIELD OF THE INVENTION

The present invention relates to the field of semiconductor processing, and more particularly, to reduction of electromigration voids in metal interconnect structures.

BACKGROUND OF THE INVENTION

The escalating requirements for high density and performance associated with ultra large scale integration (ULSI) semiconductor device wiring are difficult to satisfy in terms of providing submicron-sized, low resistance-capacitance (RC) metallization patterns. This is particularly applicable when the submicron features, such as vias, contact areas, lines, trenches, and other shaped openings or recesses have high aspect ratios (depth-to-width) due to miniaturization. Conventional semiconductor devices typically comprise a semiconductor substrate, usually a doped monocrystalline silicon (Si), and plurality of sequentially formed interlayer dielectrics and electrically conductive patterns. An integrated circuit is formed therefrom containing a plurality of patterns of conductive lines separated by inter-wiring spacings. Typically, the conductive patterns of vertically spaced metallization layers are electrically connected by vertically oriented conductive plugs filling via holes formed in the interlayer dielectric layer separating the metallization layers, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and micro-miniaturization requirements.

A commonly employed method for forming conductive plugs for electrically interconnecting vertically spaced metallization layers is known as "damascene"-type processing. Generally, this processing involves forming an opening (or via) in the dielectric interlayer, which will subsequently separate the vertically spaced metallization layers. The via is typically formed using conventional lithographic and etching techniques. After the via is formed, the via is filled with conductive material, such as tungsten or copper, using conventional techniques. Excess conductive material on the surface of the dielectric interlayer is then typically removed by chemical mechanical planarization (CMP).

High performance microprocessor applications require rapid speed of semiconductor circuitry, and the integrated circuit speed varies inversely with resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Aluminum is conventionally employed because it is relatively inexpensive, exhibits low resistivity, and is relatively easy to etch. However, as the size for openings for vias/contacts and trenches is scaled down to the submicron ranges, step coverage problems result from the use of aluminum. Poor step coverage causes high current density and enhanced electromigration. Moreover, low dielectric constant polyamide material, when employed as dielectric interlayers, create moisture/bias reliability problems when in contact with aluminum, and these problems have decreased the reliability of interconnections formed between various metallization layers.

Copper (Cu) and Cu-based alloys are particularly attractive for use in VLSI and ULSI semiconductor devices, which require multi-level metallization layers. Copper and copper-based alloy metallization systems have very low resistivities, which are significantly lower that tungsten and even lower than those of previously preferred systems utilizing aluminum and its alloys. Additionally, copper has a higher resistance to electromigration. Furthermore, copper and its alloys enjoy a considerable cost advantage over a number of other conductive materials, notably silver and gold. Also, in contrast to aluminum and refractory-type metals, copper and its alloys can be readily deposited at low temperatures formed by well-known (wet) plating techniques, such as electroless and electroplating techniques, at deposition rates fully compatible with requirements of manufacturing throughput.

FIG. 1 depicts a schematic cross-section of a portion of a metal interconnect structure employing copper damascene technology. The lower level metal layer 10 (including a copper line), also referred to as M1, is connected to a higher level metal layer 16 (including a copper line) through a via 14. Barrier layers 18 and 20, formed of nitride, for example, cover the metal layers 10, 16. The metal layer 10, 16 are separated by a dielectric layer 12, such as formed by an oxide, for example. The via 14 is filled with metal to form a conductive plug 15.

The formation of the via 14 involves performing a via etch through the dielectric layer 12 and the barrier layer 20, stopping on the underlying metal layer 10. A pre-sputter etch process, using argon, for example, is normally employed prior to the via barrier and copper deposition.

Electromigration (EM) has been defined as the transport of metal atoms by momentum exchange between electrons, moving under the influence of a field, and metal ions. Two of the critical interfaces for electromigration in the copper damascene structure of FIG. 1 are the interface V1M1 at 22 and V1M2 at 24. Electromigration testing of the V1M1 interface 22 involves flowing electrons from the upper copper line in metal layer 16 (M2) through the conductive plug 15 and the via 14 and into the lower copper line in metal layer 10 (M1). Electromigration testing of the V1M2 interface 24 involves electrons flowing in the opposite direction. In the case of the V1M1 interface 22, electromigration voids typically generate at the copper/nitride or (copper/barrier) interface at the via 14. This is depicted in FIG. 2, where the electromigration void 26 is shown. The presence of a electromigration void 26 reduces the reliability of the device.

When aluminum is used as the interconnect material, it is well known that many alloy elements may be employed to improve the aluminum resistance to electromigration. One of the most widely used alloy elements is copper in aluminum. When copper is added in small concentrations to aluminum, the electromigration reliability increases by orders of magnitude. Similarly, alloy elements for copper have been under study. However, there are process differences between aluminum and copper that render the insertion of an alloy in the copper process flow a challenging proposition. For example, aluminum is a deposition, pattern and etch process, while copper is typically a damascene process with a physical vapor deposition (PVD) seed and electrochemical fill process.

Attempts have been made to introduce the alloy into the copper lines during electrochemical deposition, but many alloys of copper are not electrically active in aqueous solution. Another potential solution is to sputter the copper alloys during the PVD copper seed deposition, but there is a problem in that the alloy elements tend to sputter at a different rate than the copper matrix since different metals have different sputter yields. Another problem has been alloy elements uniformity in the line after processing, which is determined by the seed thickness, aspect ratio, percent alloy in the copper target, annealing conditions, and plating process. An additional problem affecting alloy uniformity is linewidth variations.

SUMMARY OF THE INVENTION

There is a need for inserting an alloying element for a copper interconnect at critical electromigration failure sites to provide direct improvement of electromigration.

These and other needs are met by embodiments of the present invention which provide a metal interconnect structure comprising a copper line, and a dielectric layer over the copper line. A via extends through the dielectric layer to the copper line. A conductive plug fills the via and contacts the copper line. There is a solid solution of copper and an alloying element in the copper line in an area of the copper line adjacent the conductive plug.

By providing a solid solution of copper and an alloying element only in the area of the copper line adjacent the conductive plug, the alloying element inhibits the formation of electromigration voids at the most critical electromigration failure site, and thereby increases the reliability of the metal interconnect structure in a readily manufacturable manner.

The earlier stated needs are also met by another aspect of the present invention which provides a method of selectively alloying an element to interconnect metallization, comprising the steps of etching an opening through a dielectric layer to expose a portion of an underlying metallization layer. An alloying element is implanted into the exposed portion of the metallization layer. A remaining portion of the metallization layer remains substantially free of the alloying element. A solid solution is formed of the alloying element and the metallization layer at the exposed portion.

The use of ion implantation of an alloying element into an exposed portion of a metallization layer provides a site-specific introduction of an alloying element to a critical electromigration failure site, thereby providing a direct improvement of electromigration properties of the copper line.

The earlier stated needs are also met by another aspect of the present invention which provides a method of implanting an alloying element for copper below a via at the top of a copper line covered by a dielectric layer. Steps of the method comprise ion implanting an alloying element into the copper line only at the top of the copper line that is exposed by the via. A conductive plug is formed in the via. The copper line is annealed, thereby causing formation of a solid solution of the alloying element at the top of the copper line that is covered by the conductive plug.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to electromigration void formation in copper lines of metal interconnect structures. In particular, the present invention addresses the forming of electromigration voids at the interface between a copper interconnect line and a conductive plug overlying and connecting to the copper line. This is achieved in embodiments of the present invention by ion implanting an alloying element through the via into the copper line, filling the via with copper, and subsequently annealing to form a solid solution of the alloying element and the copper line. Hence, the solid solution is formed at the particular electromigration failure site that is of most concern.

Figure 1:
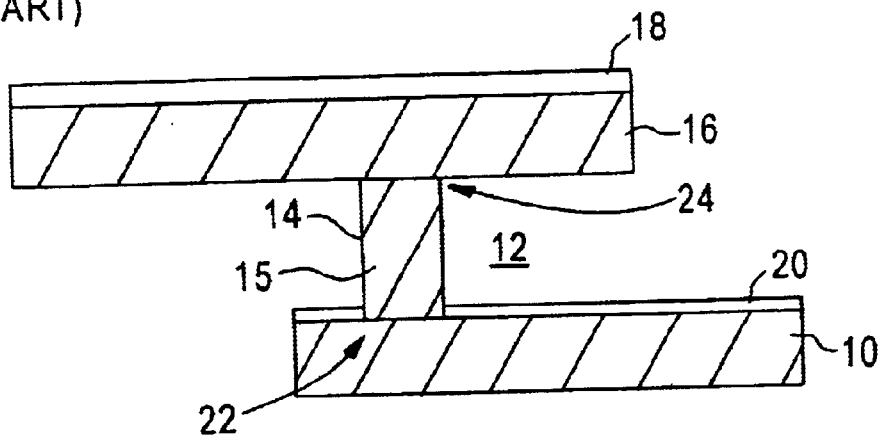
FIG. 1 is a cross-section of a metal interconnect structure constructed in accordance with prior art methodologies.
Figure 2:
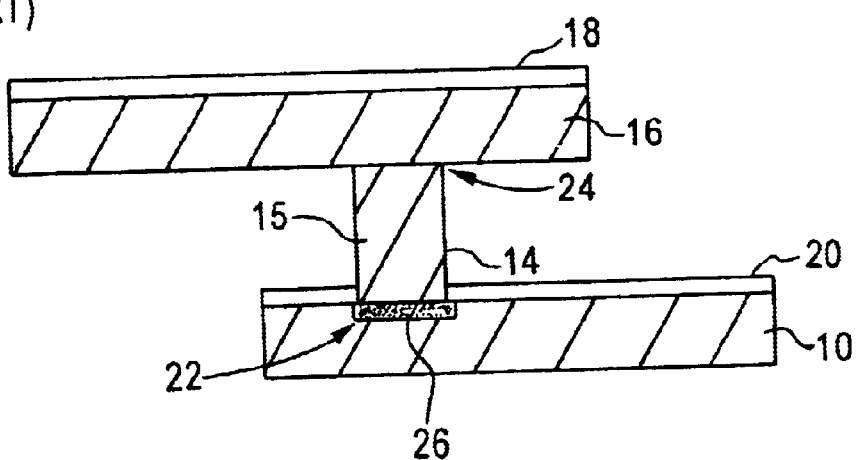
FIG. 2 depicts the structure of FIG. 1, with an electromigration void in a structure formed by metal interconnect processing methodologies of the prior art.
Figure 3:
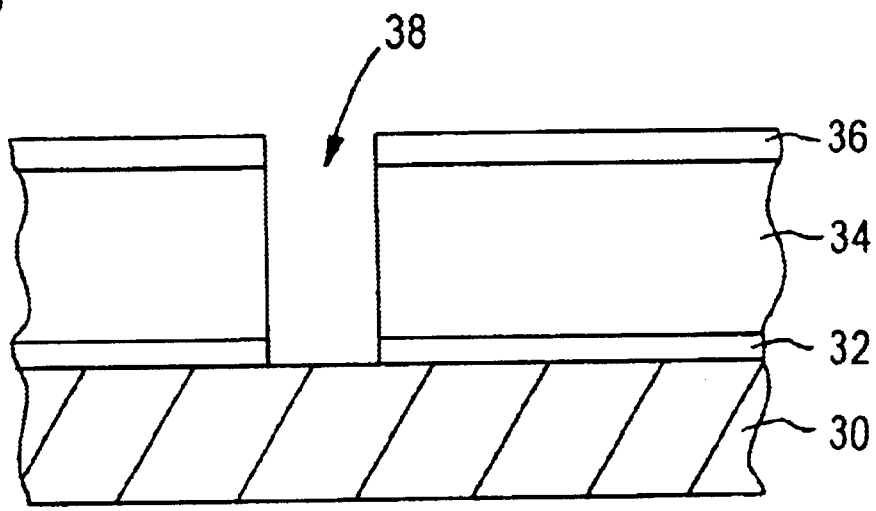
FIG. 3 depicts a cross-section of a portion of a metal interconnect structure during processing in accordance with embodiments of the present invention.

FIG. 3 is a cross-section that schematically depicts a portion of a metal interconnect structure formed in accordance with embodiments of the method of the present invention. In the described embodiment, the metal comprising the metal interconnect lines and conductive plugs is copper or copper-based alloy. However, the ion implantation method of providing alloying elements to a specific site in the metal interconnect structure may be used with other metals without departing from the scope of the present invention.

In FIG. 3, a copper line 30 is covered by a barrier layer 32, which may be made of a nitride, for example. Barrier layer 32 protects the copper layer 30 during etching of the overlying dielectric layer 34, as well as protecting the dielectric layer 34 from contamination by the diffusion of copper from the copper line 30. The dielectric layer 34 may be made of an oxide, for example, or other dielectric material. Particular advantage may be achieved by forming the dielectric layer 34 from a low k dielectric material, which reduces the resistance-capacitance (RC) of the structure.

The dielectric layer 34 may also include an anti-reflective coating 36 (ARC), such as is typically employed in conjunction with dielectric layers to improve the lithographic and etching processes. A via 38 is etched through the dielectric layer and the barrier layer 32, reaching the copper line 30. This may be accomplished in single or multiple etching steps.

Figure 4:
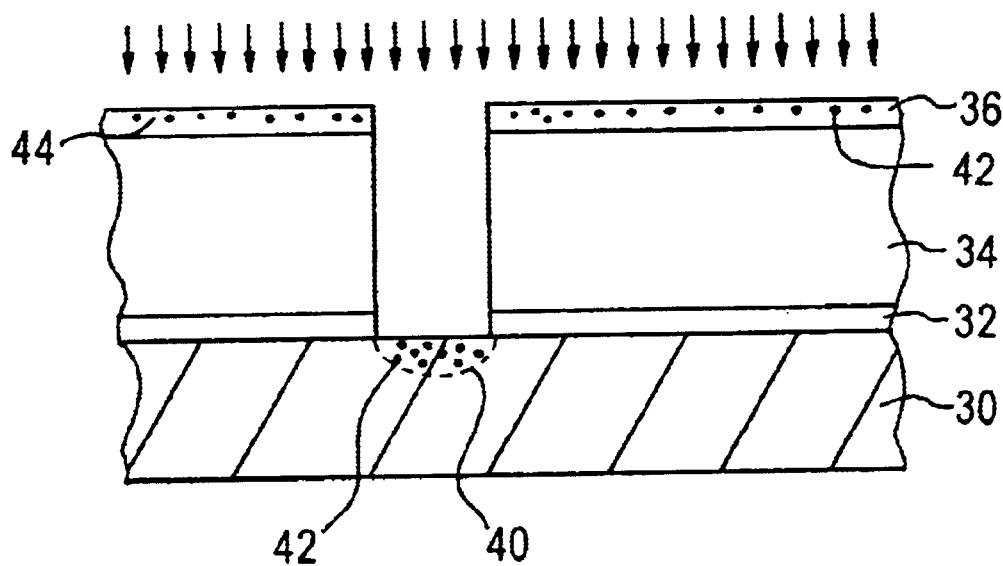
FIG. 4 is a depiction of the portion of FIG. 3, following the ion implantation of an alloying element into the exposed portion of the copper line, in accordance with embodiments of the present invention.

With a portion of the copper line 30 now exposed by the via 38, an ion implantation procedure is performed, as schematically depicted in FIG. 4. The ions 42 that are implanted are of an alloying element that helps to improve the copper resistance to electromigration. Candidate elements includes Sn, Pd, C, Ca, Mg, Al, and Hf. Of these candidate elements, either Al or Sn currently are considered to be the preferred alloying element. However, other alloying elements may be employed without departing from the scope of the present invention. The following description of the invention will assume that either Sn or Al are used as the alloying element ion implanted into the copper.

An exemplary implant energy of about 10 keV will provide a layer of approximately 100 Å deep mixture of alloying element. The energy of the implants is limited by the depth of the projection range of those species in the interlayer dielectric 34. Otherwise, a leaky path may be created between vias. Hence, the ARC layer 36 may be considered an ion implantation stop layer. Other types of layers may also serve this purpose, such as an etch stop layer, or an interlayer dielectric.

The ions 42 implanted through the via 38 into the copper line 30 create an implanted region 40 in the copper line 30. Outside of the via 38, an ion implanted region 44 is created in the ARC 36 of the dielectric layer 34.

Hence, due to the shielding of the copper line 30 by the ARC 36 and the oxide of the dielectric layer 34, only the exposed portion of the copper line 30 is implanted with the alloying element. The alloying element is thus introduced at the most critical electromigration failure site, thereby providing direct improvement of electromigration properties. The alloying element is ion implanted with a dosage of between about $1 \times 10^{15}$ and about $1 \times 10^{17}$. These values are exemplary only, as a greater or lesser concentration may be employed to provide an appropriate ion implanted region 40 in the copper line 30.

Figure 5:
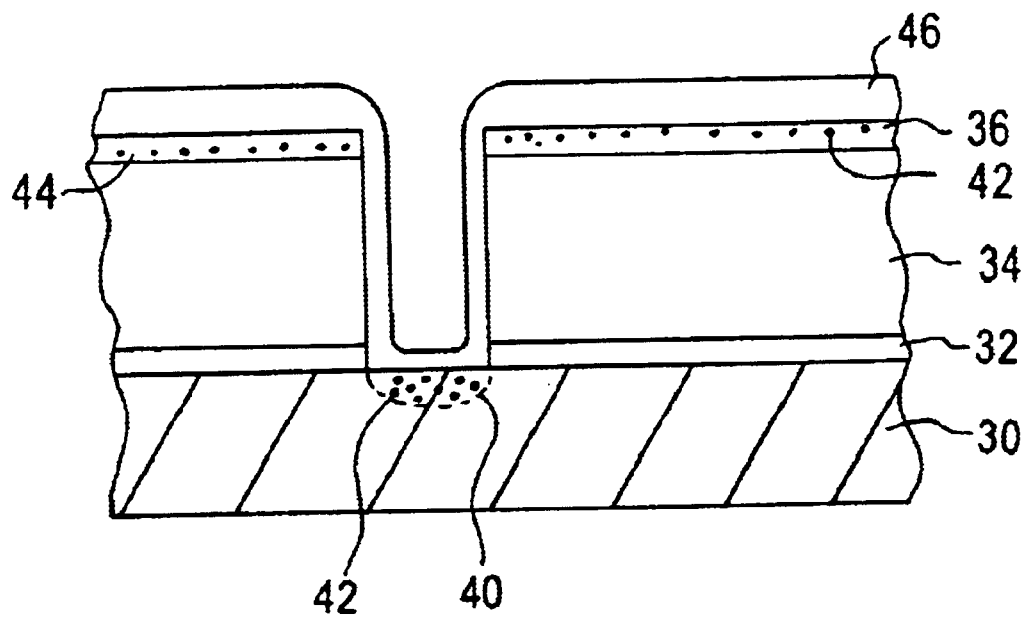
FIG. 5 shows the portion of FIG. 4 following the deposition of a barrier metal within the via, in accordance with embodiments of the present invention.

Following the ion implantation of the alloying element at the specific region 40 in the copper line 30, a refractory barrier metal layer 46 is deposited within the via 38 and over the dielectric layer 34, 36. This is shown in FIG. 5. The barrier metal layer 46 may comprise a material such as tantalum or tantalum nitride, for example. Other refractory barrier metals may be used without departing from the scope of the present invention. The barrier metal layer 46 may be deposited by conventional deposition techniques known to those with ordinary skill in the art.

Figure 6:
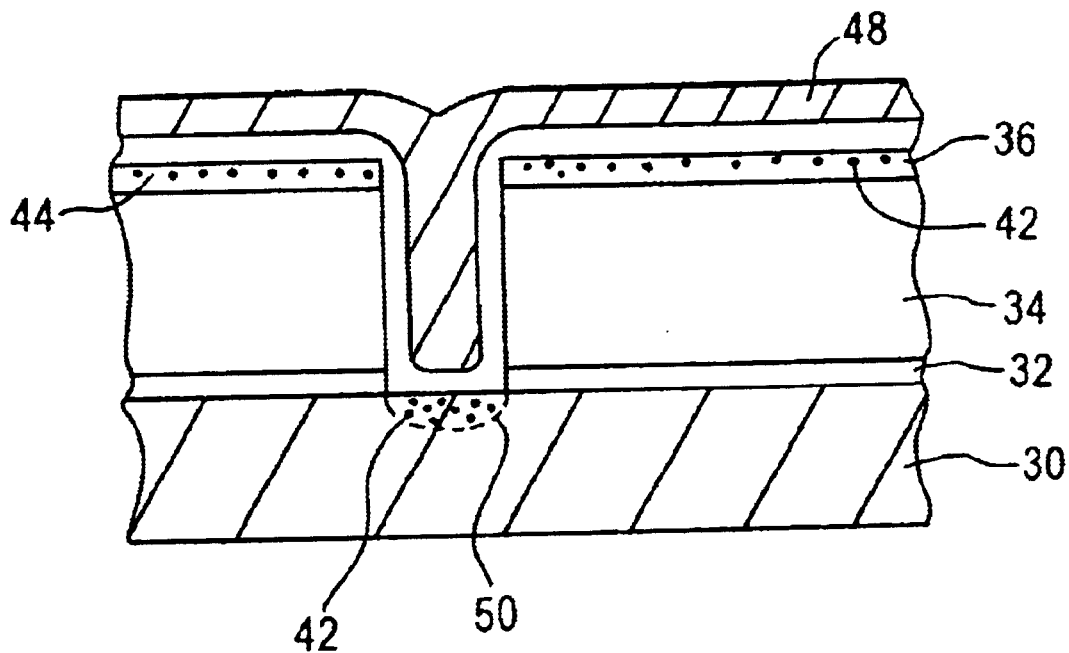
FIG. 6 depicts the portion of FIG. 5 following the filling of the via with copper or a copper based alloy and the annealing of the structure to form a solid solution of alloy and copper, in accordance with embodiments of the present invention.

A copper fill process is then performed to provide copper or a copper based alloy within the via 38, as depicted in FIG. 6. The copper fill process may be a conventional process, such as electricalchemical deposition or chemical vapor deposition, as examples. The copper filling typically is performed after the formation of a copper seed layer on the barrier metal layer 46. These steps are not shown, and are known to those with ordinary skill in the art. Following the copper fill step, an annealing process is performed that creates a solid solution of the alloying element in the copper in the copper line 30. The solid solution, provided with reference numeral 50, exhibits an increased resistance to electromigration in comparison to pure copper or copper-based alloy in the rest of the copper line 30. The annealing may be performed at temperatures of between about 100° C. and 400° C. for between about 10 to 50 minutes in certain embodiments, and between about 200° C. and 300° C. for about 30 minutes in especially preferred embodiments. This annealing causes the formation of the solid solution of the alloy elements and the copper. The solid solution 50, although depicted in FIG. 6 as residing only in the copper line 30, may also be formed in the via 38 during the annealing step.

Figure 7:
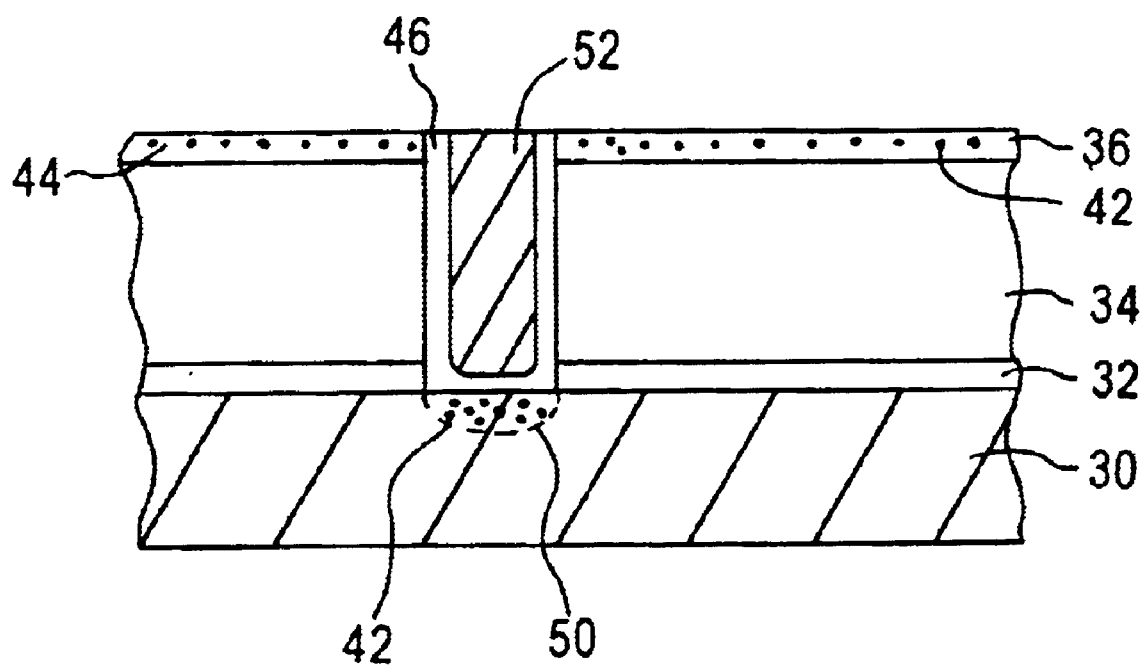
FIG. 7 shows the structure of FIG. 6 after a planarization process removes excess copper, excess barrier material and a portion of the dielectric layer, in accordance with embodiments of the present invention.

A planarization is performed, as depicted in FIG. 7, that removes the excess copper fill 48, excess barrier metal layer 46, and the ion implanted region 44. Removal of the ion implanted region 44 prevents leakage between vias, since this region 44 contains alloying element 42. An ARC layer 36 is typically removed during planarization, such as by chemical-mechanical polishing. By proper selection of the implantation species and selection of the ion implant energies as described above, it may be ensured that the implanted ions 42 are implanted only to a depth that will be removed by subsequent planarization processes.

The structure thus formed, as shown in FIG. 7, includes a conductive plug 52, contacting the copper line 30 at the solid solution region 50 that contains the alloy elements and copper. Accordingly, the electromigration properties of the copper line are improved at a critical electromigration failure site, thereby providing direct improvement of electromigration properties of the copper.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A metal interconnect structure comprising:
    a copper line;
    a dielectric layer over the copper line;
    a via extending through the dielectric layer to the copper line;
    a conductive plug filling the via and contacting the copper line; and
    a solid solution of copper and alloy elements in the copper line only in an area of the copper line adjacent the conductive plug.

2. The structure of claim 1, further comprising an etch stop layer between the dielectric layer and the copper line.

3. The structure of claim 2, wherein the alloy elements is at least one of the following elements: Sn, Pd, C, Ca, Mg, Al, and Hf.

4. The structure of claim 3, wherein the conductive plug comprises copper.

5. The structure of claim 4, wherein the via has sidewalls and the conductive plug further comprises a refractory barrier metal lining the sidewalls of the via and between the copper of the conductive plug and the copper line.

6. The structure of claim 5, wherein the alloy elements in the copper line consists of implanted ions.

7. A method of selectively alloying an element to interconnect metallization, comprising the steps of:
    etching an opening through a dielectric layer to expose a portion of an underlying metallization layer;

ion implanting alloy elements into the exposed portion of the metallization layer, a remaining portion of the metallization layer remaining substantially free of the alloy elements; and forming a solid solution of the alloy elements and the metallization layer at the exposed portion.

8. The method of claim 7, wherein the metallization layer is made of copper or a copper-based alloy.

9. The method of claim 8, wherein the alloy elements is at least one of Sn, Pd, C, Ca, Mg, Al, and Hf.

10. The method of claim 9, further comprising depositing a barrier layer in the opening and filling the opening with copper or a copper-based alloy.

11. The method of claim 10, wherein the dielectric layer includes an ion implantation stop layer that substantially prevents further penetration of ions into the dielectric layer beyond the ion implantation stop layer.

12. The method of claim 11, further comprising removing the ion implantation stop layer.

13. The method of claim 12, wherein the step of removing the ion implantation stop layer comprises chemical mechanical polishing.

14. The method of claim 13, wherein the alloy elements is implanted with a dosage of between about $1\times10^{15}$ and about $1\times10^{17}$, with an implantation energy of about 10 keV.

15. The method of claim 14, wherein the step of forming a solid solution comprises annealing at a temperature of between about 150° C. to about 400° C. for between about 10 minutes to about 90 minutes.

16. The method of claim 9, wherein the alloy elements is implanted with a dosage of between about $1\times10^{15}$ and about $1\times10^{17}$, with an implantation energy of about 10 keV.

17. The method of claim 16, wherein the step of forming a solid solution comprises annealing at a temperature of between about 200° C. to about 300° C. for about 30 minutes.

18. A method of implanting alloy elements for copper below a via at a top of a copper line covered by a dielectric layer, comprising the steps of:

ion implanting an alloy elements into the copper line only at the top of the copper line that is exposed by the via;

forming a conductive plug in the via; and annealing to cause formation of a solid solution of the alloy elements at the top of the copper line that is covered by the conductive plug.

19. The method of claim 18, wherein the alloy elements is at least one of Sn, Pd, C, Ca, Mg, Al, and Hf, and the ion implantation is performed with a dosage of between about $1\times10^{15}$ and about $1\times10^{17}$, and an implantation energy of about 10 keV.

20. A method of implanting alloy elements for copper below a via at a top of a copper line covered by a dielectric layer, comprising the steps of:

ion implanting an alloy elements into the copper line only at the top of the copper line that is exposed by the via;

forming a conductive plug in the via;

annealing to cause formation of a solid solution of the alloy elements at the top of the copper line that is covered by the conductive plug;

wherein the alloy elements is at least one of Sn, Pd, C, Ca, Mg, Al, and Hf, and the ion implantation is performed with a dosage of between about $1\times10^{15}$ and about $1\times10^{17}$, and an implantation energy of about 10 keV; and wherein ions of the alloy elements implant into a portion of the dielectric layer during the ion implanting of the alloy elements into the copper line, the method further comprising removing the portion of the dielectric layer into which the ions of the alloy elements implanted.

* * * * *